(12) United States Patent
Kutzer et al.

(10) Patent No.: US 9,076,922 B2
(45) Date of Patent: Jul. 7, 2015

(54) METHOD FOR FITTING CONTACT WIRES TO A SURFACE OF A PHOTOVOLTAIC CELL, PHOTOVOLTAIC CELL, PHOTOVOLTAIC MODULE, ARRANGEMENT FOR FITTING CONTACT WIRES TO A SURFACE OF A PHOTOVOLTAIC CELL

(75) Inventors: Martin Kutzer, Penig (DE); Olaf Storbeck, Dresden (DE); Harald Hahn, Dresden (DE); Andreas Krause, Radebeul (DE); Christian Koch, Poehl (DE)

(73) Assignee: SolarWorld Innovations GmbH, Freiberg (DE)

( * ) Notice: Subject to any disclaimer, the term of this patent is extended or adjusted under 35 U.S.C. 154(b) by 284 days.

(21) Appl. No.: 13/087,434

(22) Filed: Apr. 15, 2011

(65) Prior Publication Data

US 2011/0253191 A1    Oct. 20, 2011

(30) Foreign Application Priority Data

Apr. 16, 2010    (DE) .......................... 10 2010 016 476

(51) Int. Cl.
*H01L 31/05* (2014.01)
*H01L 31/18* (2006.01)
*H01L 23/00* (2006.01)

(52) U.S. Cl.
CPC .......... *H01L 31/188* (2013.01); *Y10T 29/53213* (2015.01); *Y02E 10/50* (2013.01);
(Continued)

(58) Field of Classification Search
CPC ............. H01L 31/224; H01L 31/0216; H01L 31/022425; H01L 31/18; H01L 31/188; H01L 31/0504; H01L 24/85; H01L 2224/48; H01L 2224/85; Y02E 10/50

USPC ........... 136/252; 438/57, 64, 98, 617, 72, 62; 257/E21.506, E31.124, E31.128, 257/E31.001; 29/748; 174/126.1
See application file for complete search history.

(56) References Cited

U.S. PATENT DOCUMENTS

| 4,380,112 A | * | 4/1983 | Little ............................. 438/64 |
| 5,084,107 A | * | 1/1992 | Deguchi et al. ............... 136/256 |

(Continued)

FOREIGN PATENT DOCUMENTS

| CN | 101290954 A | 10/2008 |
| DE | 10239845 C1 | 12/2003 |

(Continued)

OTHER PUBLICATIONS

Summhammer et al., "Rectangular Silicon Solar Cell With More Power and Higher Voltage Modules", Vienna University of Technology, Atominstitut, In: 24th European Photovoltaic Solar Energy Conference, Sep. 2009, Hamburg, Germany, pp. 2221-2224.

*Primary Examiner* — William F Kraig
*Assistant Examiner* — Pavel Ivanov

(57) ABSTRACT

In various embodiments, a method for fitting contact wires to a surface of a photovoltaic cell is provided. The method may include: feeding the contact wires to a contact wire positioning and placement device, wherein the contact wire positioning and placement device comprises a plurality of nozzles or eyes, wherein at least one contact wire is in each case passed through a respective nozzle or eye, for positioning and placement thereof onto the surface of the photovoltaic cell; positioning and placing the contact wires on the surface of the photovoltaic cell by means of the contact wire positioning and placement device; and attaching the contact wires to the surface of the photovoltaic cell.

14 Claims, 12 Drawing Sheets

(52) U.S. Cl.
CPC ...... *H01L 24/85* (2013.01); *H01L 2924/01078* (2013.01); *H01L 2924/01079* (2013.01); H01L 31/0504 (2013.01); *H01L 2224/45147* (2013.01); *H01L 2224/85* (2013.01); *H01L 2924/01015* (2013.01); *H01L 2924/01047* (2013.01); *H01L 2924/00014* (2013.01); *H01L 2924/12032* (2013.01)

(56) References Cited

U.S. PATENT DOCUMENTS

| | | | |
|---|---|---|---|
| 5,151,373 | A | 9/1992 | Deguchi et al. |
| 5,942,048 | A | 8/1999 | Fujisaki et al. |
| 7,262,124 | B2 * | 8/2007 | Fujisawa ............ 438/617 |
| 7,432,438 | B2 | 10/2008 | Rubin et al. |
| 8,299,350 | B2 | 10/2012 | Saita et al. |
| 8,399,283 | B2 | 3/2013 | Fork et al. |
| 2002/0056473 | A1 | 5/2002 | Chandra et al. |
| 2003/0019518 | A1 | 1/2003 | Shimizu et al. |
| 2005/0217718 | A1 | 10/2005 | Dings et al. |
| 2005/0221613 | A1 | 10/2005 | Ozaki et al. |
| 2007/0158621 | A1 * | 7/2007 | Sakamoto et al. ............ 252/500 |
| 2010/0024881 | A1 | 2/2010 | Hacke et al. |
| 2010/0078073 | A1 * | 4/2010 | Krause et al. ................ 136/261 |
| 2011/0244625 | A1 * | 10/2011 | Riordon et al. ................ 438/98 |

FOREIGN PATENT DOCUMENTS

| | | |
|---|---|---|
| DE | 102008020749 A1 | 10/2009 |
| DE | 102008044910 A1 | 3/2010 |
| JP | 2005347628 A | 12/2005 |
| JP | 2007300128 A | 11/2007 |
| TW | 200913296 A | 3/2009 |
| WO | 2009129803 A2 | 10/2009 |
| WO | 2009156086 A2 | 12/2009 |
| WO | 2010022911 A2 | 3/2010 |

* cited by examiner

METHOD FOR FITTING CONTACT WIRES TO A SURFACE OF A PHOTOVOLTAIC CELL, PHOTOVOLTAIC CELL, PHOTOVOLTAIC MODULE, ARRANGEMENT FOR FITTING CONTACT WIRES TO A SURFACE OF A PHOTOVOLTAIC CELL

CROSS-REFERENCE TO RELATED APPLICATION

This application claims priority to German Patent Application Serial No. 10 2010 016 476.3, which was filed Apr. 16, 2010, and is incorporated herein by reference in its entirety.

TECHNICAL FIELD

Various embodiments relate to a method for fitting contact wires to a surface of a photovoltaic cell, a photovoltaic cell, a photovoltaic module, and an arrangement for fitting contact wires to a surface of a photovoltaic cell.

BACKGROUND

A photovoltaic cell (for example a solar cell) is normally formed by a substrate having a front face (also referred to as the emitter face) and a rear face, wherein an (electrically conductive) contact structure (for example in the form of so-called contact fingers) is fitted to at least one of the two faces. The contact structure typically has a width of at least 100 μm, while its thickness is only about 10 μm to 15 μm. A greater contact structure width leads to a reduction in the efficiency because of the increased shadowing resulting from this, while a reduction in the width results in the disadvantage that the line resistance of the contact structure is increased. Furthermore, the current through the individual contact structures is combined in so-called busbars, thus causing further shadowing of the front face surface.

In general, photovoltaic cells (for example solar cells) are connected by means of contact ribbons which are soldered to the busbars of the photovoltaic cell (for example a solar cell). In this case, all of the current is passed through the contact ribbons. In order to keep the resistance losses as low as possible, these contact ribbons have to have a certain total cross-sectional area. This results in a loss because of the shadowing on the front face. A further disadvantage is that the busbar exerts stresses on the paste-wafer interface during soldering, and thus can lead to fracturing of the photovoltaic cell.

In order to create an improved photovoltaic module, the contact structure of the photovoltaic cell (for example a solar cell) and the number and dimensions of the contact ribbons (also referred to in the following text as contact wires) should therefore be optimized, combined.

In this case, it has been found that good optimization results from a large number of thin contact wires which run parallel. It can also be expected that reduced mechanical stresses resulting from the different thermal coefficients of expansion of the wire and photovoltaic cell (for example a solar cell) are formed because of the point fixing of the wires to the photovoltaic cell (for example a solar cell).

One problem in this case is the handling and the positioning of the thin contact wires on the photovoltaic cell (for example a solar cell).

Patent specification DE 102 39 845 C1 describes a method in which the contact wires are fixed to an optically transparent film with the aid of an optically transparent adhesive, and are then fixed to the metallization of a solar cell. In this case, the film and adhesive remain in the solar cell module; this implies relatively stringent requirements for the adhesive and the film, in terms of long-term stability, and thus results in relatively high costs.

SUMMARY

In various embodiments, a method for fitting contact wires to a surface of a photovoltaic cell is provided. The method may include: feeding the contact wires to a contact wire positioning and placement device, wherein the contact wire positioning and placement device comprises a plurality of nozzles or eyes, wherein at least one contact wire is in each case passed through a respective nozzle or eye, for positioning and placement thereof onto the surface of the photovoltaic cell; positioning and placing the contact wires on the surface of the photovoltaic cell by means of the contact wire positioning and placement device; and attaching the contact wires to the surface of the photovoltaic cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The following comprehensive description refers to the attached drawings, which form part thereof and which illustrate specific embodiments in which the invention can be implemented. In this context, direction terminology such as "top", "bottom", "front", "rear", "forward", "rearward", etc. is used with reference to the orientation of the described figure or figures. Since components of embodiments can be positioned in a number of different orientations, the direction terminology is used for illustrative purposes, and is in no way restrictive. It is self-evident that other embodiments can be used and structural or logical changes can be made without departing from the scope of protection of the present invention. It is self-evident that the features of the various embodiments described herein can be combined with one another, unless specifically stated to the contrary. The following comprehensive description should therefore not be regarded in a restrictive sense, and the scope of protection of the present invention is defined by the attached claims.

For the purposes of this description, the terms "joined", "connected" and "coupled" are used to describe both a direct and an indirect joint, a direct or indirect connection and a direct or indirect coupling. Identical or similar elements are provided with identical reference symbols in the figures, where this is expedient.

Various embodiments relate to an arrangement or an apparatus for connecting photovoltaic cells (for example solar cells) in a photovoltaic module (for example in a solar module), the photovoltaic cell (for example the solar cell) with the corresponding metallization for fixing the contact wires, and a photovoltaic module (for example in a solar module) which is formed from the described solar cells, which are connected by means of the technique described in the various embodiments.

The connection step can be carried out before, after or during the production of the metallization layer (for example the contact structure) of the photovoltaic cell (for example the solar cell). Various variants are described in the embodiments.

Figure 1:
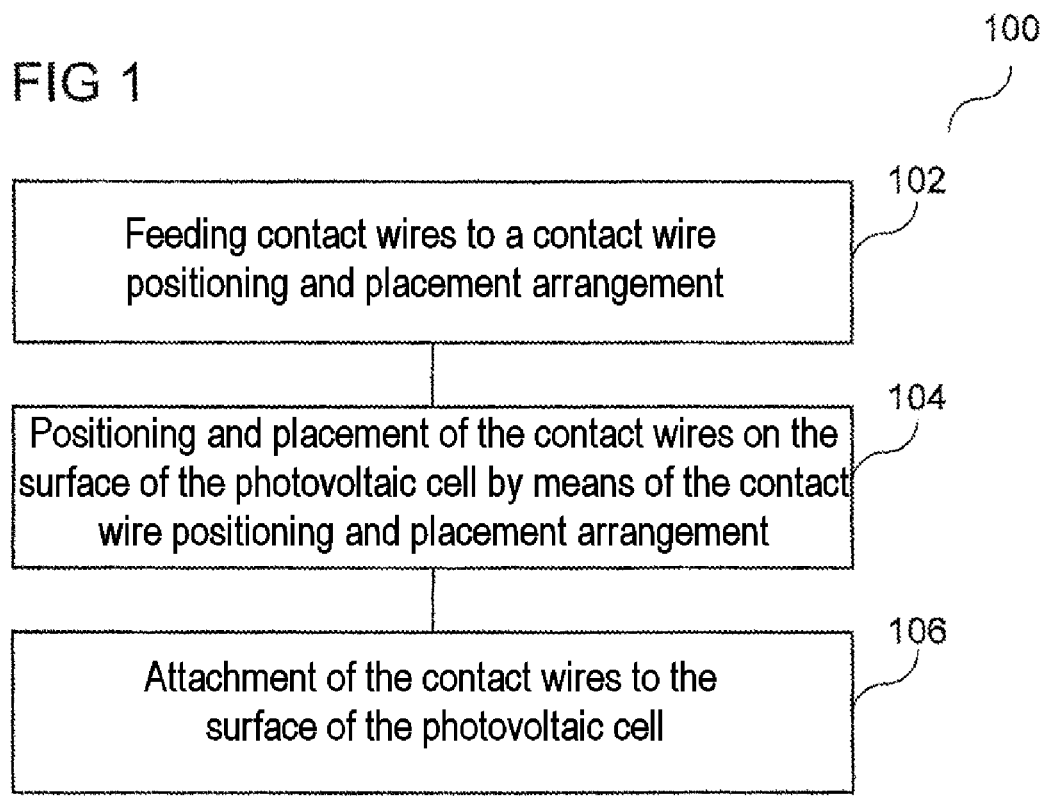
FIG. 1 shows a flowchart of one embodiment of a method for fitting contact wires to a surface of a photovoltaic cell.

FIG. 1 shows a flowchart 100, illustrating one embodiment of a method for fitting contact wires to a surface (for example to an emitter face 204 or to a rear face (not illustrated) of a photovoltaic cell 202 (cf. for example FIG. 2)).

A photovoltaic cell 202 is provided. The photovoltaic cell 202 may have a substrate, for example a glass substrate of a photovoltaic thin-film module. Furthermore, the substrate may have at least one photovoltaic layer (also referred to as an emitter layer) 206. Alternatively, at least one photovoltaic layer 206 may be arranged on or over the substrate. The photovoltaic layer 206 may have semiconductor material (for example silicon), compound semiconductor material (for example III-V compound semiconductor material (for example GaAs), II-VI compound semiconductor material (for example CdTe, I-III-V compound semiconductor material (for example copper-indium disulfide). As an alternative, the photovoltaic layer 206 may have an organic material. In various embodiments, the silicon may have or may consist of monocrystalline silicon, polycrystalline silicon, amorphous silicon, and/or microcrystalline silicon. The photovoltaic layer 206 may have a semiconductor junction, for example a pn junction structure, a pin junction structure, a Schottky junction structure, or the like.

Furthermore, in various embodiments, the photovoltaic layer 206 may have or consist of a thin semiconductor film. In this case, the thin semiconductor film can be arranged on or above the substrate, which may include or consist of a glass plate, for example.

Furthermore, in various embodiments, an optically transparent electrically conductive layer may optionally be arranged on or above the at least one photovoltaic layer 206. The optically transparent electrically conductive layer may, for example, include a thin film containing indium-tin oxide or tin oxide (which can be formed, for example, by means of sputtering).

Furthermore, in various embodiments, an antireflective layer, for example composed of silicon nitride or any other suitable material, may be provided on the photovoltaic layer 206 or the optional optically transparent electrically conductive layer.

Furthermore, one or more contact structures, for example in the form of electrically conductive contact structures 208 (for example in the form of contact fingers 208) may be fitted to the photovoltaic cell 202, wherein the contact structure or structures may be formed by an electrically conductive paste which, as will be explained in more detail in the following text, may be burnt into the antireflective layer in various embodiments before, during or after the fitting of the contact wires, thus allowing an electrical connection to be formed between the contact wires and the photovoltaic layer 206 or the optional optically transparent electrically conductive layer, by means of the electrically conductive contact structures 208. Furthermore, electrically conductive contact structures 208 may also be provided on the rear face of the photovoltaic cell 202.

The contact structure or structures 208 may be fitted in the form of lines, segments (lines) or points. In various embodiments, the contact structure or structures 208, for example the individual contact fingers, may each have a width of at least 10 µm, for example a width of at least 50 µm. The thickness of the contact structures 208 may be in a range from approximately 1 µm to approximately 50 µm, for example in a range from approximately 5 µm to approximately 15 µm.

The contact structure or structures may be fitted by means of a contact structure fitting device (not illustrated), in which case the contact structure fitting device may be designed to fit the contact structure by means of a screen printing process or by means of an extrusion printing process. The contact structure fitting device according to various refinements may clearly have a screen printing device or an extrusion printing device (for example with a plurality of extrusion printing heads).

A greater contact structure width leads to a reduction in the efficiency because of the increased shadowing resulting from this, while a reduction in the width results in the disadvantage that the line resistance of the contact structure is increased.

In various embodiments, a multiplicity of contact wires 210 are provided and are positioned and placed on the surface 204 (for example on the exposed surface of the antireflective layer when the contact wires are subsequently burnt in with a paste) of the photovoltaic cell 202. In various embodiments, more than 10 contact wires 210 are provided, for example more than 15 contact wires 210, for example more than 25 contact wires 210, for example more than 40 contact wires 210. In various embodiments, thin contact wires 210 are provided, with the contact wires 210 having a diameter, for example, of less than, for example, 400 μm, for example a diameter of less than, for example, 350 μm, for example a diameter of less than, for example, 300 μm, for example a diameter of less than, for example, 250 μm.

The contact wires 210 may run essentially parallel to one another, or alternatively at an angle to one another. In various embodiments, a form of thin network, with contact wires connected like a wire mesh, can be connected to the photovoltaic cell (this could, for example, result in advantages when burning in the paste-coated contact wires). The contact wires 210 may be designed to collect and transmit electrical power, for example electric current, which is produced by the photovoltaic cell 202, for example by the at least one photovoltaic layer 206.

The contact wires 210 may include or consist of electrically conductive material, for example metallic conductive material, which may contain or consist of one or more of the following metals: Cu, Al, Au, Pt, Ag, Pb, Sn, Fe, Ni, Co, Zn, Ti, Mo, W, and/or Bi. The contact wires 210 may include or consist of a metal chosen from a group consisting of: Cu, Au, Ag, Pb, and Sn. Furthermore, the contact wires 210 may be coated with a metal, for example with silver, nickel and/or tin. The contact wires 210 may be in the form of copper wires which, for example, are provided with a diffusion bather layer (for example composed of Ni, Co) and/or a solder layer (for example Sn, Pb, Ag, Sn—Pb—Ag).

The contact wires 210 may in general have any desired cross section, for example a round cross section, an oval cross section, a triangular cross section, a rectangular cross section (for example a square cross section) or a cross section of any other desired polygonal shape. Furthermore, the contact wires 210 may have a structured surface, for example such that they reflect large proportions, such that the reflected light is totally internally reflective on the glass and is reflected back to the surface of the emitter face.

According to the method in 102, the contact wires 210 are fed (for example by means of a contact wire feed device 212) to a contact wire positioning and placement device 214, and in 104 the contact wires 210 are positioned and placed on the surface of the photovoltaic cell 202 by means of the contact wire positioning and placement device 212. In 106, the contact wires 210 may be attached to the surface 204 of the photovoltaic cell 202.

Figure 2:
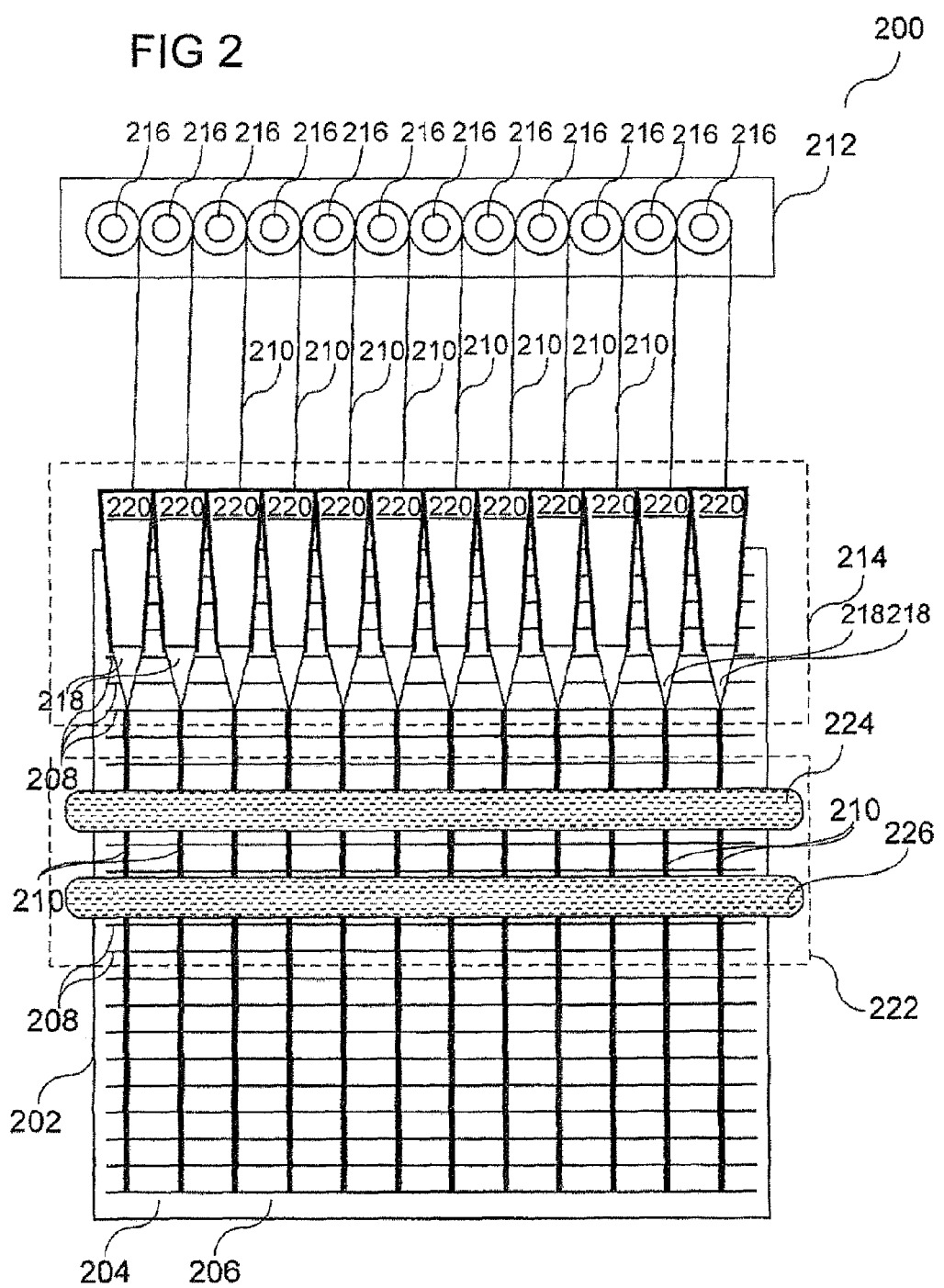
FIG. 2 shows one embodiment of a device for fitting contact wires to a surface of a photovoltaic cell.

FIG. 2 shows one embodiment of an arrangement 200 for fitting contact wires to a surface of a photovoltaic cell.

The arrangement 200 may include a contact wire feed device 212, which itself may have a plurality of contact wire rolls 216. A contact wire 210 or a plurality of contact wires 210 may be rolled up on each contact wire roll 216, and may be actively unrolled therefrom.

Furthermore, the arrangement 200 may include a contact wire positioning and placement device 214 to which the contact wires 210 are fed from the contact wire feed device 212. The contact wire positioning and placement device 214 is designed for positioning and placement of the contact wires 210 on the surface 204 (for example on the surface 204 of an antireflective layer) of the photovoltaic cell 202. In various embodiments, the contact wire positioning and placement arrangement 214 may have a plurality or a multiplicity of nozzles 218 or eyes 218, in which case at least one contact wire 210 is in each case fed through a respective nozzle 218 or eye 218, for positioning and placement thereof on the surface 204 of the photovoltaic cell 202. A respective holding area 220 may be provided, associated with a respective nozzle 218 or eye 218, and is designed to hold the respective fed contact wire 210. In various embodiments, the holding area 220 may be in the form of a funnel, with the larger opening being intended to hold the respective fed contact wire 210 and the smaller opening being intended to feed the respective contact wire 210 to the associated nozzle 218 or eye 218. The contact wire 210 fed through the respective nozzle 218 or eye 218 is then placed on the surface 204 (for example on the surface 204 of an antireflective layer) of the photovoltaic cell 202 in accordance with the position of the respective nozzle 218 or eye 218 above the photovoltaic cell 202. The multiplicity of nozzles 218 or eyes 218 may be arranged alongside one another and may be aligned "on the output side" (for example by means of an associated control system which is not illustrated) such that the contact wires 210 are placed essentially parallel to one another on the surface 204 (for example on the surface of a contact structure or a plurality of contact structures and in this case for example also on the surface 204 of the antireflective layer) of the photovoltaic cell 202.

In various embodiments, the contact wire positioning and placement arrangement 214 may additionally be designed to provide the function for the contact wires 210 passed through it, for example to apply flux to the contact wires 210. According to various embodiments, the process of providing the function may be or may have soldering, flux coating, coating and/or preheating of the contact wires 210.

The arrangement 200 may furthermore include an attachment device 222 for attachment of the contact wires 210 to the surface 204 (for example to the surface 204 of an antireflective layer) of the photovoltaic cell 202.

The contact wire positioning and placement device 214 may be designed such that the contact wires 210 are placed directly on the contact structure or structures 208; and the attachment device 222 may be designed such that the contact wires 210 are attached with the contact structure or structures 208.

In various embodiments, the attachment device 222 includes one or more soldering apparatuses 224 and, optionally, one or more hold-down means 226 which holds or hold together the structure that has been heated by the soldering process, while cooling down.

Alternatively, the attachment device 222 has an adhesive apparatus 224 and optionally a hold-down means 226, which holds together the structure with the electrically conductive adhesive (applied by means of the adhesive apparatus 224) while the electrically conductive adhesive is solidified. In this context, it should be noted that, for adhesion, the adhesive would be applied to the contact wire or the contact wires, or would be applied to the photovoltaic cell before the contact wires are placed there. To this extent, FIG. 2 would have to be appropriately adapted in this embodiment.

Furthermore and alternatively, the attachment device 222 may have a bonding apparatus 224, in which case there is no need for the hold-down means.

Various embodiments provide for the contact structure or structures 208 to be burnt in on the surface 204 of the photovoltaic cell 202; in which case the contact wires 210 are then attached with the contact structure or structures 208. This may be done, for example, by means of heating which is provided for this purpose and burns in the contact structure or structures 208 on the surface 204 of the photovoltaic cell 202. By way of example, the heating may be integrated in the soldering apparatus 224.

In yet another refinement, the contact wire positioning and placement device 214 may be designed such that the contact structure or structures 208 is or are fitted to the surface 204 of the photovoltaic cell 202, and the contact wires 210 are positioned and placed on the surface 204 of the photovoltaic cell 202 in a joint process step, in which case, in various embodiments, the attachment device 222 is designed such that contact wires coated with paste (possibly copper wire coated with a nickel diffusion barrier) are placed on the photovoltaic cell and are burnt in together with the contact wires in a subsequent process.

According to various embodiments, thin contact wires 210 are therefore clearly drawn or fed from an apparatus 214 for the wiring, which apparatus 214 consists, for example, of an arrangement of essentially parallel nozzles, eyes or guide rolls. The contact wires 210 are fed from the positioning and placement apparatus 214 and can be fixed on the photovoltaic cell 202 (for example the solar cell 202).

Figure 3:
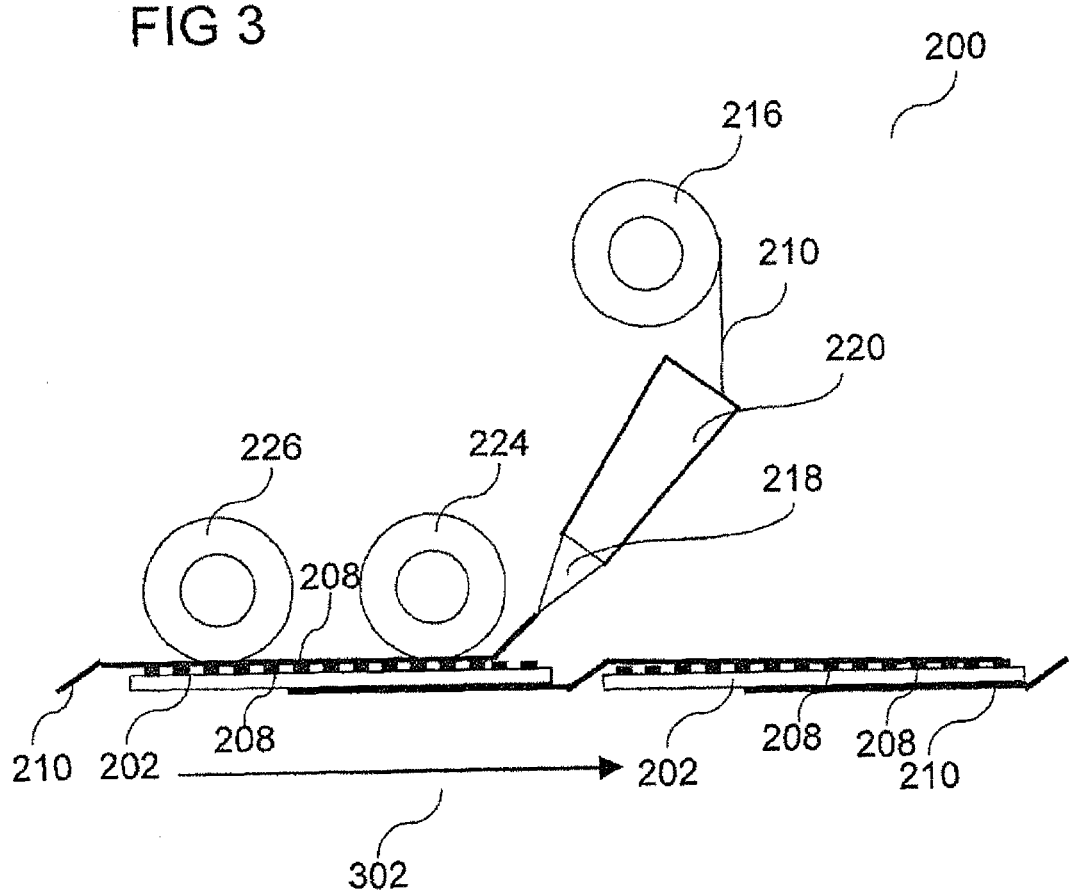
FIG. 3 shows a side view of one embodiment of a device for fitting contact wires to a surface of a photovoltaic cell.

FIG. 3 shows a side view of one embodiment of the arrangement 200 for fitting contact wires 210 to a surface 204 of a photovoltaic cell 202, illustrating the wiring of a plurality of photovoltaic cells 202 (in this example, only two photovoltaic cells 202 are shown, for simplicity reasons). An arrow 302 indicates the movement direction of the contact wire positioning and placement device 214 and of the attachment apparatus 222 (for example with the soldering apparatus 224 and the hold-down means 226), relative to the photovoltaic cells 202 (from left to right in FIG. 3).

As illustrated in FIG. 2 and FIG. 3, in various embodiments, the contact wires 210 are positioned and placed on the surface 204 of the photovoltaic cell 202 by means of the contact wire positioning and placement arrangement 214, and the presoldered contact wires 210 are then heated by means of the soldering apparatus 224, and the solder is melted on. During solidification, the contact wires 210 are pressed by the hold-down means 226 onto the contact structure 208, thus forming a soldered joint between the contact wires 210 and the contact structure 208. A plurality of photovoltaic cells 202 may be connected (for example in series) such that the contact wires 210 which are fitted and fixed to the emitter face of a photovoltaic cell 202 (or in other words the front face) are then fitted and fixed on the rear face of the next photovoltaic cell 202 (for example on its rear face metallization). A photovoltaic module may then be formed in various embodiments from the photovoltaic cells 202 which have been electrically coupled to one another.

In general, the previous cell process corresponds otherwise to a conventional cell process, but with an adapted grid design (according to the setting of the contact wire positioning and placement arrangement 214) (in which case, according to various embodiments, no busbars are provided).

As has been described above, a respective contact wire 210 passes through the contact wire positioning and placement device 214. The respective contact wire 210 may be made functional in the contact wire positioning and placement device 214, for example by soldering, coating with flux and/or preheating.

In various embodiments, the soldering apparatus 224 solders the respective contact wire 210 to the printed (for example screen-printed or extrusion-printed) contact structures 208 and the next hold-down apparatus 226 (in the process flow) holds the contact wires 210 down until the soldered joint has solidified. In this context, it should be noted that the contact wires 210 may be positioned and placed at any desired angle relative to the photovoltaic cell 202 or the contact structures 208.

In various embodiments, the contact structures 208 are burnt in even before the photovoltaic cell 202 is fed to the contact wire positioning and placement arrangement 214, and the contact wires 210 are placed and soldered (or adhesively bonded, etc.) there.

Figure 4:
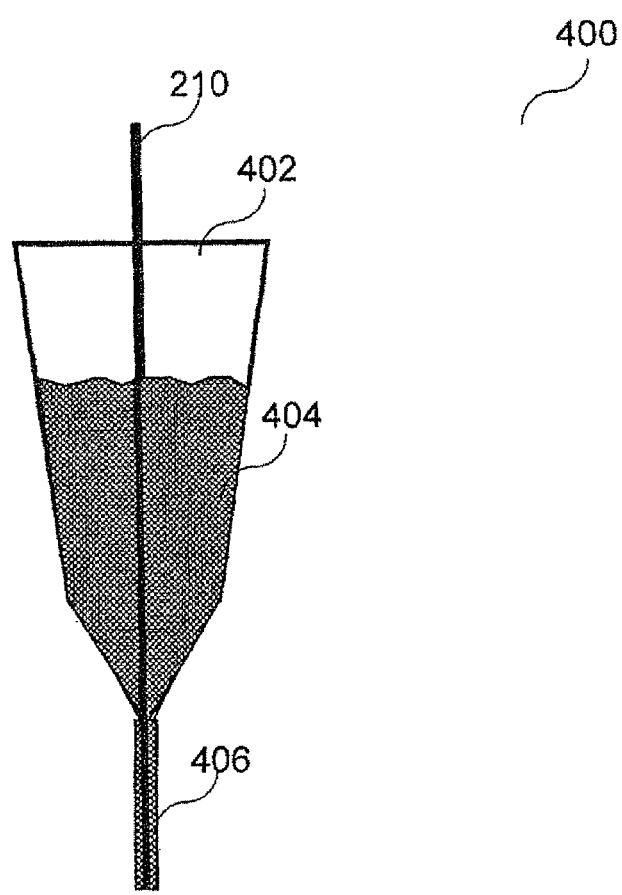
FIG. 4 shows one embodiment of a contact wire positioning and placement device, illustrating how a contact wire is made functional, for example by coating with solder, flux or a paste.

FIG. 4 shows a detail of one embodiment of a contact wire positioning and placement device 400.

In various embodiments, the processes of application (for example printing, for example screen printing or extrusion printing) of the contact structures 208 and the connection of the photovoltaic cells 202 to one another are combined. In other words, a further embodiment provides for the contact wires 210 to be placed at any desired angle with respect to the lines of the (for example screen printing paste) of the contact structures which has not yet dried after the contact structures have been printed (for example during the screen printing or extrusion printing).

In order to prevent contamination of the cell as a result of copper diffusion, for example, various embodiments provide for the respective contact wire 210 to have a diffusion barrier layer, for example with nickel and/or silver.

By way of example, this therefore allows a paste which forms the contact structures 208 to be applied to the photovoltaic cell 202, and the respective contact wire 210 can then be placed in the paste while it is still wet and liquid. The burning-in process therein can be carried out after the contact wires 210 have been placed into the paste while it is still wet and liquid.

After the paste has been applied (for example the screen printing paste) the contact wires 210 are placed into the (for example screen printing paste) before it is dry. The highly viscous paste fixes the wires on the photovoltaic cell 202. An electrical contact is made with the emitter layer 206 of the photovoltaic cell 202 during the subsequent so-called firing step, by means of the screen printing paste, for example.

Furthermore, various embodiments provide for the contact wire positioning and placement device 214 also to be designed such that the contact wires 210 are at least partially coated with the material of the contact structure or structures 208 (for example with the paste); and for the contact wires 210 which have been coated with the material of the contact structure or structures 208 to be positioned and placed on the surface 204 of the photovoltaic cell 202 by means of the contact wire positioning and placement device 214. By way of example, a reservoir 402 filled with a paste 404, for example screen printing paste 404, may thus be accommodated in the contact wire positioning and placement device 214, through which reservoir 402 the respective contact wire 210, which has been coated with nickel for example, is fed. The respective contact wire 210 is thus coated with the paste 404 (see FIG. 3), and the coated contact wire 406 is then placed on the surface 204 of the photovoltaic cell 202. In this case, structuring of the surface of the contact wire 210 may improve the adhesion and dissemination of the paste. After the respective contact wire 210 has been placed on the photovoltaic cell 202, the paste 404 once again fixes it on the surface 204 of the photovoltaic cell 202. During the subsequent firing step, the paste 404 (for example screen printing paste 404) opens the antireflective layer on the photovoltaic cell 202, and makes an electrical contact with the emitter layer 206 of the photovoltaic cell 202.

By way of example, the contact wire positioning and placement device 214 may therefore have at least one container through which one or more of the contact wires 210 may be passed and which contains the material 404 of the contact structure 208, such that at least a portion of the surface of the contact wires 210 is coated with the material 404 of the contact structure 208. The contact wire positioning and placement device 214 may in this case be designed such that the contact wires 210 which have been coated with the material 404 of the contact structure 208 are positioned and placed on the surface 204 of the photovoltaic cell 202 by means of the contact wire positioning and placement device 214.

Figure 5:
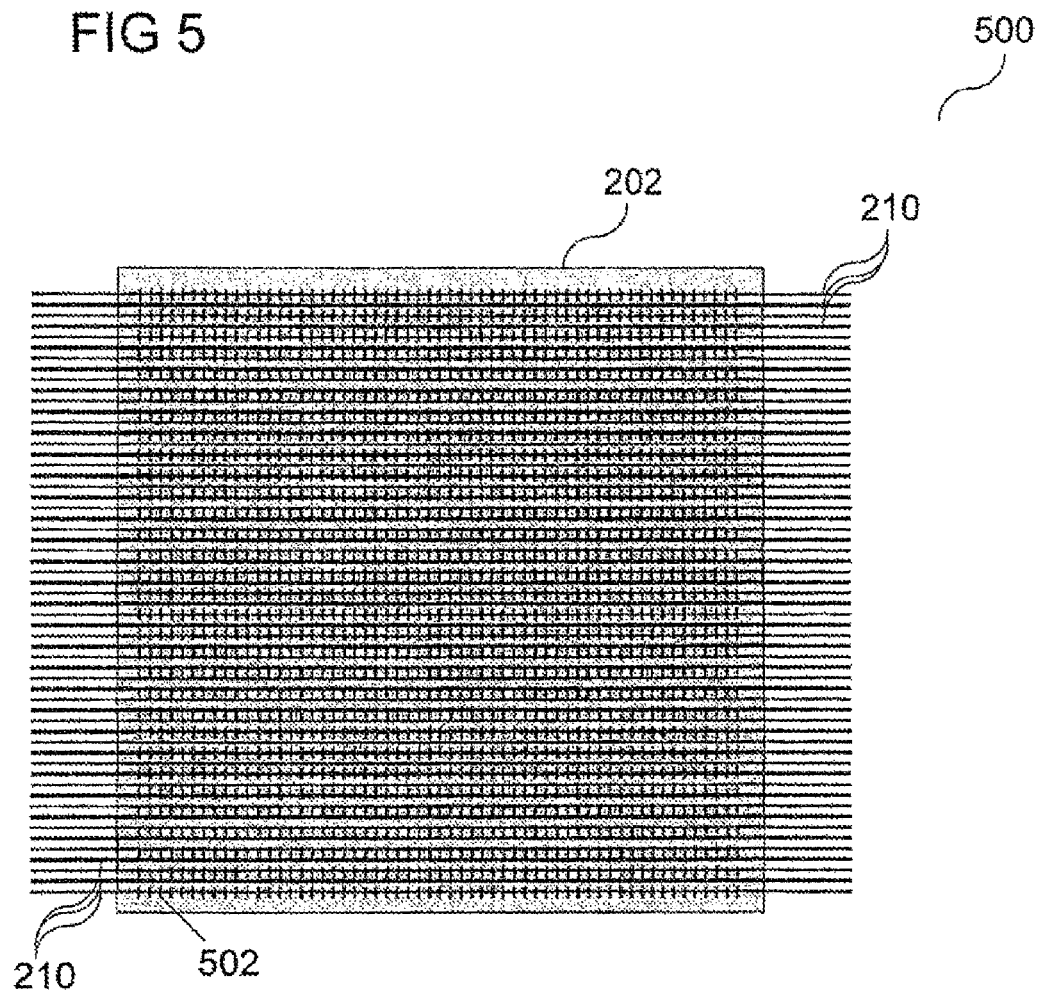
FIG. 5 shows one embodiment of a photovoltaic cell with a contact wire array with which contact has been made.

FIG. 5 shows one embodiment of a photovoltaic cell 500.

In this embodiment, the contact wires 210 are coated with a diffusion bather layer (for example composed of Ni, Co). Finally, the contact wires 210 may be chemically or electrochemically coated with silver (for example on the Ni layer). Alternatively, the entire contact wire may, for example, be composed of silver or nickel. An inkjet printer (not illustrated), by way of example, (as one implementation of the contact structure fitting device) is then used to apply a suitable paste in order to open the nitride in the form of lines, or alternatively also in the form of line segments or points, to the photovoltaic cell intermediate product (photovoltaic cell wafer with emitter (in general the photovoltaic layer) and optionally with the antireflective layer (for example $Si_3N_4$)). The paste may have a similar composition to normal front-face paste, but without any metal component. In various embodiments, the silver-plated respective contact wire 210 can be coated with this paste before being fitted. Furthermore, in various embodiments, the entire surface of the intermediate product is coated with paste that has no silver. In these cases, there is no need for the inkjet step. By way of example, the respective contact wire 210 is placed at an angle of 90° (or at any other desired angle) over the printed paste lines 502, in general over the printed paste segments 502, and is burnt in, for example at points, by means of a laser or over the entire area in an oven. In this case, the point contacts are separated by the paste line separation. These point contacts result in an additionally decreased recombination loss, and therefore increased efficiency. Finally, the excess paste can be removed. Various embodiments likewise provide for the wire to be placed directly on the photovoltaic cell 202, to be printed over at points there by means of an inkjet printer, and to be fixed immediately (for example burnt in) by means of a laser. In various embodiments, the method described above is carried out without paste, by bonding a wire containing or coated with silver.

In various embodiments, the paste may include an etching paste (which may not be the same as the metallization paste, as has been described above). The etching paste may contain metal oxides in order to open the antireflective layer, for example the silicon nitride.

Figure 6:
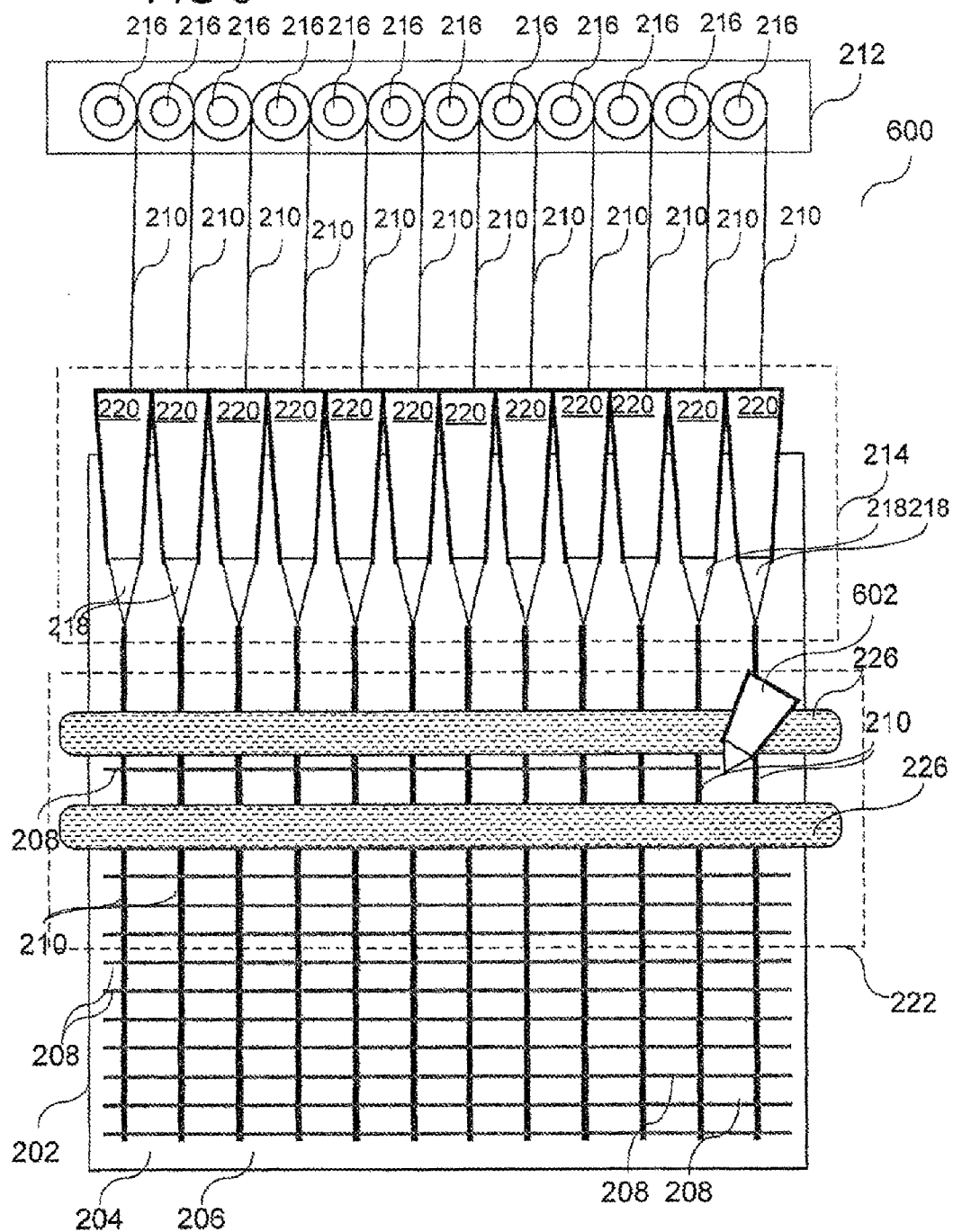
FIG. 6 shows another embodiment of an arrangement for fitting contact wires to a surface of a photovoltaic cell.

FIG. 6 shows another embodiment of an arrangement 600 for fitting contact wires 210 to a surface 204 of a photovoltaic cell 202.

In various embodiments, the contact wires 210 can be placed on the photovoltaic cell surface 204, which has been provided with an antireflective layer but has not been metalized (that is to say clearly on the photovoltaic cell surface 204 before the contact structures 208 have been fitted), and may be fixed by means of two hold-down means 226. A paste printer 602, various embodiments of which are additionally provided in the arrangement 600 and which, for example, is in the form of an inkjet printer 602, then applies a paste transversely to the direction of the contact wires 210. The contact wires 210 are therefore mechanically fixed to the photovoltaic cell 202 (for example the solar cell 202) by means of the (still adhesive) paste, for example a screen printing paste. The electrical contact may then be made by means of a high-temperature step, with the paste being burnt in.

In various embodiments, the arrangement may include a device for application of a paste composed of a material which can remove the material of the antireflective layer to a part of the antireflective layer, thus removing this part of the antireflective layer. The contact wire positioning and placement device 214 may be designed such that the contact wires 210 are placed on the paste.

In various embodiments, the photovoltaic cell 202 on which contact wires 210 have been fixed by means of the paste 208 is then moved through a metallization oven, in which the paste is burnt in, and an electrical contact is made with the emitter layer 206.

In various embodiments, the contact wire positioning and placement arrangement can be designed such that the contact wires 210 are at least partially coated with a paste composed of a material which can remove the material of the antireflective layer; and such that the coated contact wires 210 are placed on the surface 204 of the photovoltaic cell 202; and the attachment device 222 may be designed such that the contact wires 210 and the paste are heated, as a result of which the paste is burnt into the surface 204 of the photovoltaic cell 202.

According to yet another refinement, the contact wire positioning and placement arrangement may be designed such that the contact wires 210 are placed on the surface 204 of the photovoltaic cell 202; and such that the contact wires 210 are at least partially coated with a paste composed of a material which can remove the material of the antireflective layer.

The photovoltaic cell 202, on which contact wires 210 have been fixed by means of the paste 208, is then passed through a metallization oven in which the paste is burnt in and an electrical contact is made with the emitter layer 206.

The paste may be free of silver.

Furthermore, the arrangement may include a device for removal of at least a portion of the paste, which does not make the contact between the contact wires 210 and the photovoltaic cell 202, after the paste has been burnt in.

In various embodiments, a contact wire positioning and placement device is provided, for example a contact wire positioning and placement device which has a plurality (for example a number which corresponds to the number of contact wires to be positioned and placed) of contact wire feeds (for example in the form of nozzles or eyes) which are arranged alongside one another, for example parallel to one another.

In various embodiments, a photovoltaic module (for example a solar module) is manufactured from a plurality of electrically conductively connected photovoltaic cells which have been manufactured in the manner described above. By way of example, a photovoltaic module may be formed by connecting a plurality of photovoltaic cells electrically in series with one another to form photovoltaic cell strings, which are in turn electrically connected in series with one another to form a so-called photovoltaic cell matrix. The photovoltaic cell matrix is then normally embedded in a polymer and is encapsulated between, for example, two glass plates or, for example, an emitter-face glass plate and a rear-face polymer film. This assembly can normally be provided with a connecting socket and a frame, in a further process step.

In various embodiments, the front-face metallization (also referred to as the emitter-face metallization) and the connection of the photovoltaic cells in the photovoltaic module can be implemented by means of copper contact wires coated with nickel-silver, which are attached to the photovoltaic cell (for example to the solar cell) by printing by means of inkjet paste.

Figure 7:
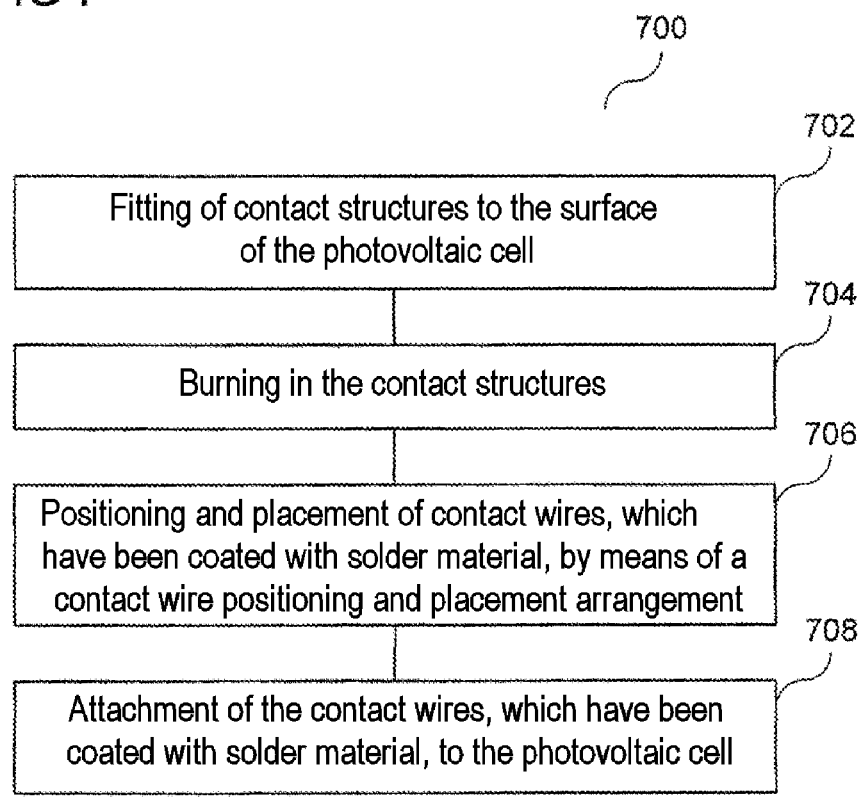
FIG. 7 shows another embodiment of a flowchart illustrating a method for fitting contact wires to a surface of a photovoltaic cell in which, by way of example, the fitting of the contact wires according to this method is followed by the contact wire structures being burnt in (in this case, the process of burning in the contact wire structures is part of a standard photovoltaic cell process which is known per se, with the shaping of the contact wire structures possibly being matched to the subsequent contact-making process)

FIG. 7 shows a flowchart 700 illustrating another exemplary embodiment of a method for fitting contact wires to a surface of a photovoltaic cell.

According to various embodiments, the contact structure or structures (for example having a plurality of contact fingers) is or are applied to the surface of the photovoltaic cell (for example to the surface of the antireflective layer) in 702 by, for example, application of a paste with an appropriate composition (with the paste being, for example, a paste which has silver (Ag), leaded glass or bismuth glass, as well as an organic solvent). The contact structure or structures may be applied, for example, by means of a printing process, for example by means of screen printing or extrusion printing.

According to various embodiments, the contact structure is then burnt in in 704, for example by means of a high-temperature step, for example at a temperature in a range from approximately 400° C. to approximately 900° C., for example for a time of approximately 1 minute to approximately 5 minutes.

According to various embodiments, the contact wires (for example copper contact wires which have been coated with soft-solder material (for example tin (Sn))) are then positioned, for example along the contact fingers, in 706.

By way of example, another arrangement may have any desired angle between the contact fingers and the contact wires. The contact wires are placed and positioned on the surface of the photovoltaic cell (for example on the surface of an antireflective layer which may be present) by means of a contact wire positioning and placement arrangement, for example by means of a contact wire positioning and placement arrangement as has been described above. The solder material can be applied to the contact wires before or during the positioning, for example by means of the device described in FIG. 4.

According to various embodiments, the contact wires which have been coated with the solder material are then optionally coated with flux in 708 for a subsequent soldering process, and are attached to the photovoltaic cell, for example by being soldered onto the photovoltaic cell.

Figure 8:
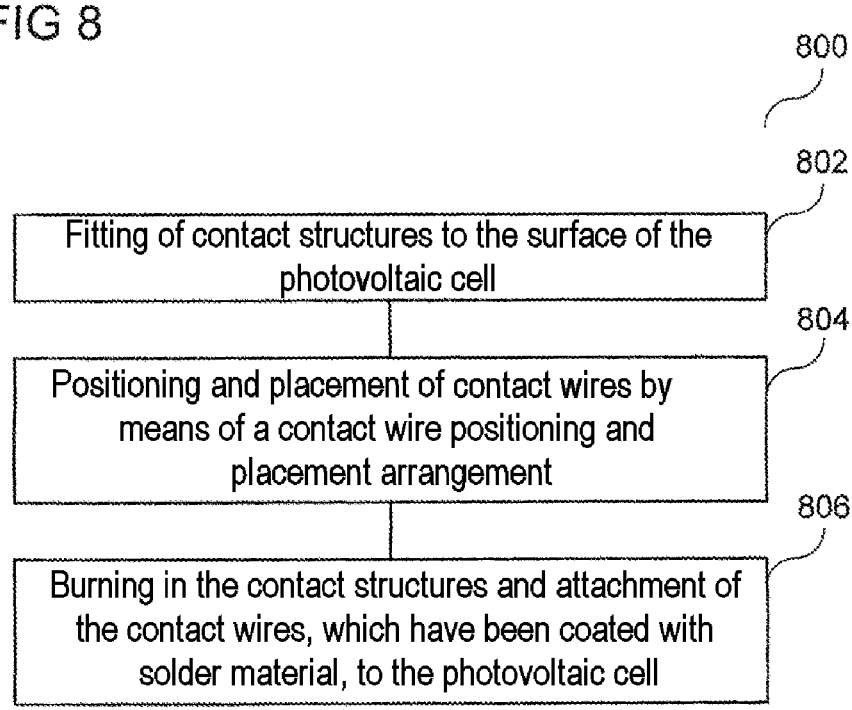
FIG. 8 shows yet another embodiment of a flowchart illustrating a method for fitting contact wires to a surface of a photovoltaic cell.

FIG. 8 shows a flowchart 800 illustrating another embodiment of a method for fitting contact wires to a surface of a photovoltaic cell.

According to various embodiments, the contact structure or structures (for example having a plurality of contact fingers) is or are applied to the surface of the photovoltaic cell (for example to the surface of the antireflective layer) in 802 by, for example, application of a paste with an appropriate composition (with the paste being, for example, a paste which has silver (Ag), leaded glass or bismuth glass, as well as an organic solvent). The contact structure or structures may be applied, for example, by means of a printing process, for example by means of screen printing or extrusion printing.

According to various embodiments, the contact wires are then positioned in 804 along or at any desired angle with respect to the contact fingers, which have not been burnt in and have not yet been dried, and are placed on the surface of the photovoltaic cell (for example on the surface of an antireflective layer which may be present) by means of a contact wire positioning and placement arrangement, for example by means of a contact wire positioning and placement arrangement as has been described above. By way of example, the contact wires may be silver contact wires, or alternatively copper contact wires which can be coated with a metal layer, for example clearly with a diffusion barrier layer (for example with nickel or cobalt), or copper contact wires which can be coated with a metal layer, for example with a silver layer. The coating which may be provided (for example nickel, cobalt or silver) on the contact wires may, according to various embodiments, be applied electrochemically before positioning.

According to various embodiments, the contact structures are then burnt in in 806 and the contact wires are fixed in the same process step, for example by means of a high-temperature step, for example at a temperature in a range from approximately 400° C. to approximately 900° C., for example for a time from approximately 1 minute to approximately 5 minutes.

In various embodiments, point contacts may be fixed to one another between the contact fingers and the contact wires. In various embodiments, this can be done by means of a laser beam.

Figure 9:
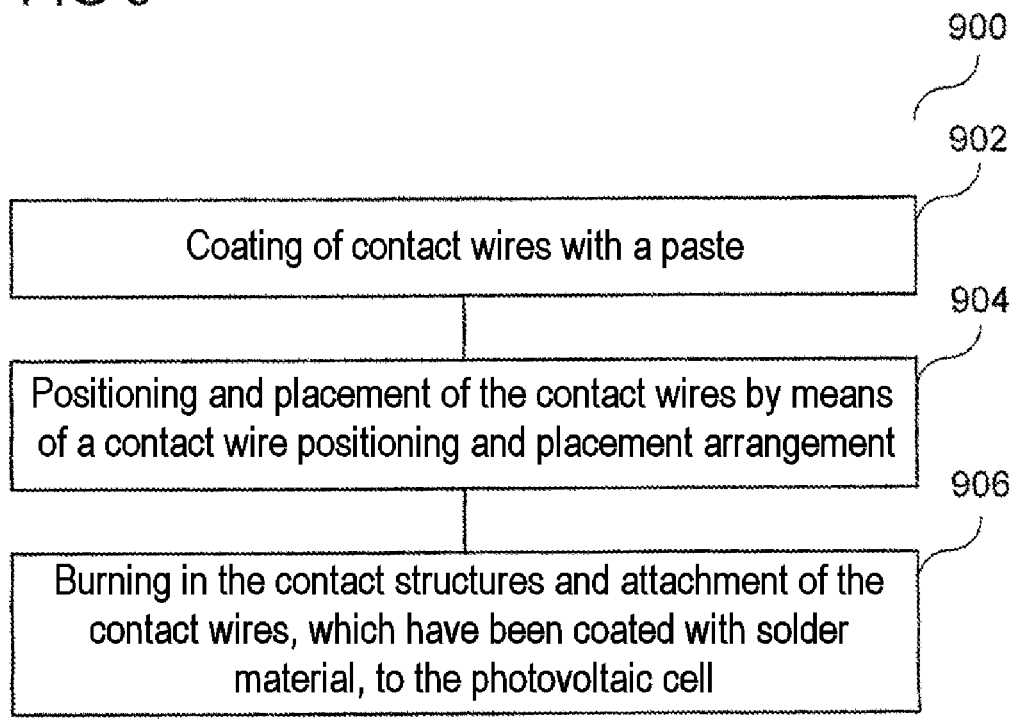
FIG. 9 shows yet another embodiment of a flowchart illustrating a method for fitting contact wires to a surface of a photovoltaic cell.

FIG. 9 shows a flowchart 900 illustrating yet another embodiment of a method for fitting contact wires to a surface of a photovoltaic cell.

According to various embodiments, contact wires which have been coated, for example, with a diffusion bather layer (for example with nickel or cobalt) are coated in 902 with a paste (generally the material with which the contact structure is formed). The coating which may be present (for example nickel or cobalt) on the contact wires can, according to various embodiments, be applied electrochemically before the positioning of the contact wires. By way of example, the paste may be a paste which has silver (Ag), leaded glass or bismuth glass, as well as an organic solvent. According to various embodiments, the paste can be applied to the contact wires before or during the positioning.

According to various embodiments, the contact wires are positioned in 904 and are placed on the surface of the photovoltaic cell (for example on the surface of an antireflective layer which may be present) by means of a contact wire positioning and placement device, for example by means of a contact wire positioning and placement device as has been described above.

According to various embodiments, the contact structures are then burnt in in 906 and the contact wires are fixed in the same process step, for example by means of a high-temperature step, for example at a temperature in a range from approximately 400° C. to approximately 900° C., for example for a time of approximately 1 minute to approximately 5 minutes.

Figure 10:
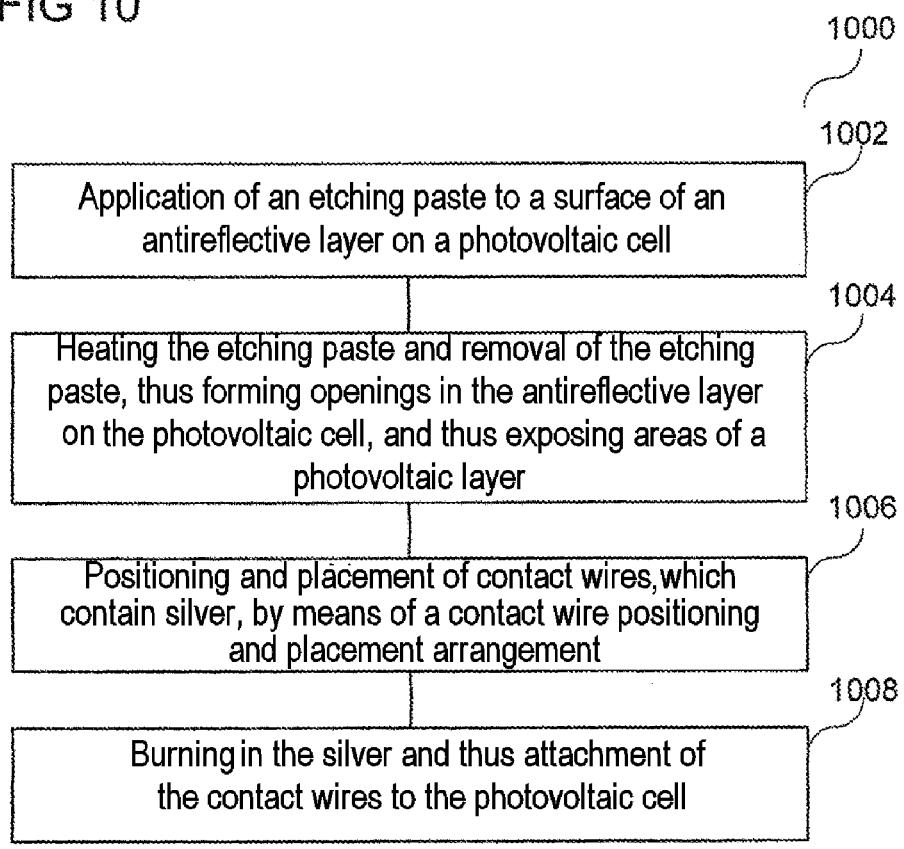
FIG. 10 shows yet another embodiment of a flowchart illustrating a method for fitting contact wires to a surface of a photovoltaic cell.

FIG. 10 shows a flowchart 1000 illustrating yet another embodiment of a method for fitting contact wires to a surface of a photovoltaic cell.

According to various embodiments, an etching paste is applied in 1002 to a surface of an antireflective layer (for example silicon nitride) on a photovoltaic cell, for example by printing the paste, for example by means of screen printing or extrusion printing. By way of example, the etching paste may be a paste which has silver (Ag), leaded glass or bismuth glass, and an organic solvent. The etching paste may be applied in the form of lines, segment lines or points.

According to various embodiments, the applied etching paste is then heated in 1004, and is thus solidified, for example at a temperature in a range from approximately 400° C. to approximately 900° C., for example for a time from approximately 1 minute to approximately 5 minutes. According to various embodiments, the etching paste removes, for example, the areas of the antireflective layer (for example silicon nitride) which come into contact with the etching paste.

The solidified etching paste is then removed, for example by stripping or etching away, as a result of which the respective areas of the antireflective layer (for example silicon nitride) underneath the etching paste are removed, thus forming openings in the antireflective layer.

By way of example, desired areas of the emitter layer are exposed by the removal of the desired areas of the antireflective layer (for example silicon nitride).

According to various embodiments, the contact wires (for example silver contact wires, alternatively for example copper contact wires which have been coated with a metal such as silver (Ag) or nickel-silver (Ag—Ni)) are then positioned in 1006 along or at any desired angle with respect to the openings formed in 1004 and are placed on the surface of the photovoltaic cell (for example on the surface of an antireflective layer which may be present) by means of a contact wire positioning and placement arrangement, for example by means of a contact wire positioning and placement arrangement as has been described above. The metal, such as silver, can, for example, be applied electrochemically in advance to the contact wires or, for example, a nickel-plated copper wire is coated with a silver paste.

According to various embodiments, the contact wires are then attached in 1008 to the photovoltaic cell, for example by burning the silver coating on the contact wires into the photovoltaic cell.

Figure 11:
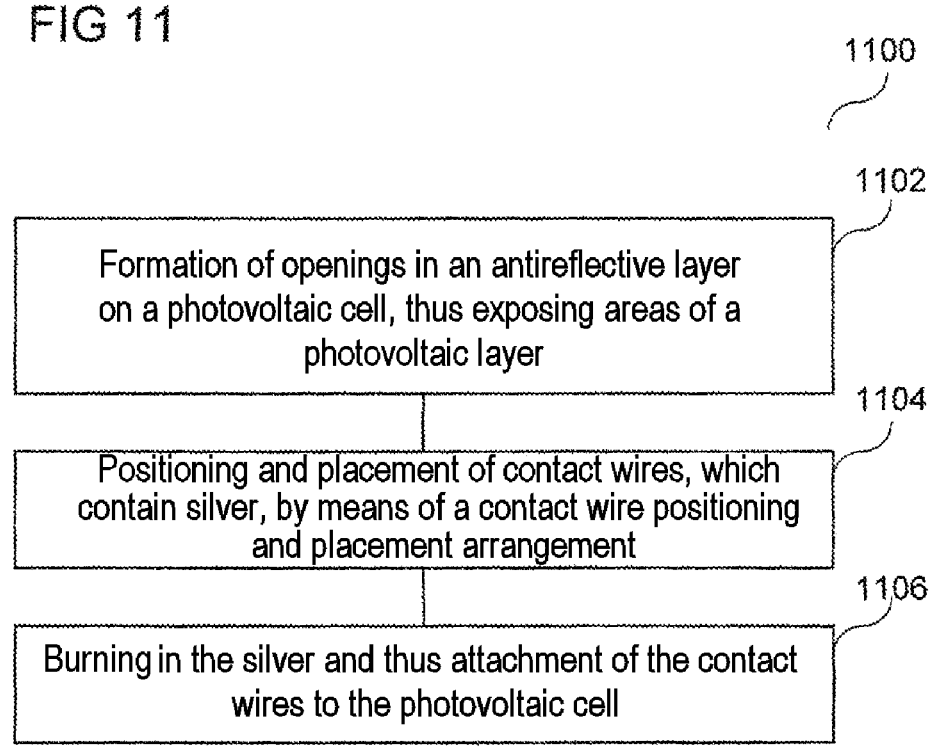
FIG. 11 shows yet another embodiment of a flowchart illustrating a method for fitting contact wires to a surface of a photovoltaic cell.

FIG. 11 shows a flowchart 1100 which illustrates yet another embodiment of a method for fitting contact wires to a surface of a photovoltaic cell.

In various embodiments, openings are formed in an antireflective layer (for example silicon nitride) in 1102, such that areas of a photovoltaic layer of a photovoltaic cell (for example a solar cell) are exposed. The desired areas of the antireflective layer (for example silicon nitride) may be opened as in the method described in FIG. 10 or, for example, by means of so-called liquid chemical processing, in which a laser beam is injected into a liquid jet (which contains an etching solution for etching the antireflective layer (for example silicon nitride)), in order to heat the bombarded areas. The etching solution may include a dopant, for example phosphorus, as a result of which the exposed areas of the emitter layer are at the same time doped more heavily.

According to various embodiments, the contact wires (for example silver contact wires, alternatively for example copper contact wires which have been coated with a metal such as silver (Ag) or a paste containing silver) are then positioned in 1104 along or at any desired angle (if, for example, a paste containing silver has been applied to the contact wires) with respect to the openings formed in 1102, and are placed on the surface of the photovoltaic cell (for example on the surface of an antireflective layer which may be present) by means of a contact wire positioning and placement device, for example by means of a contact wire positioning and placement device as has been described above. The metal, such as silver, can be applied in advance, for example electrochemically, to the contact wires.

According to various embodiments, the contact wires are then attached to the photovoltaic cell in 1106, for example by burning the silver of the contact wires into the photovoltaic cell.

Figure 12:
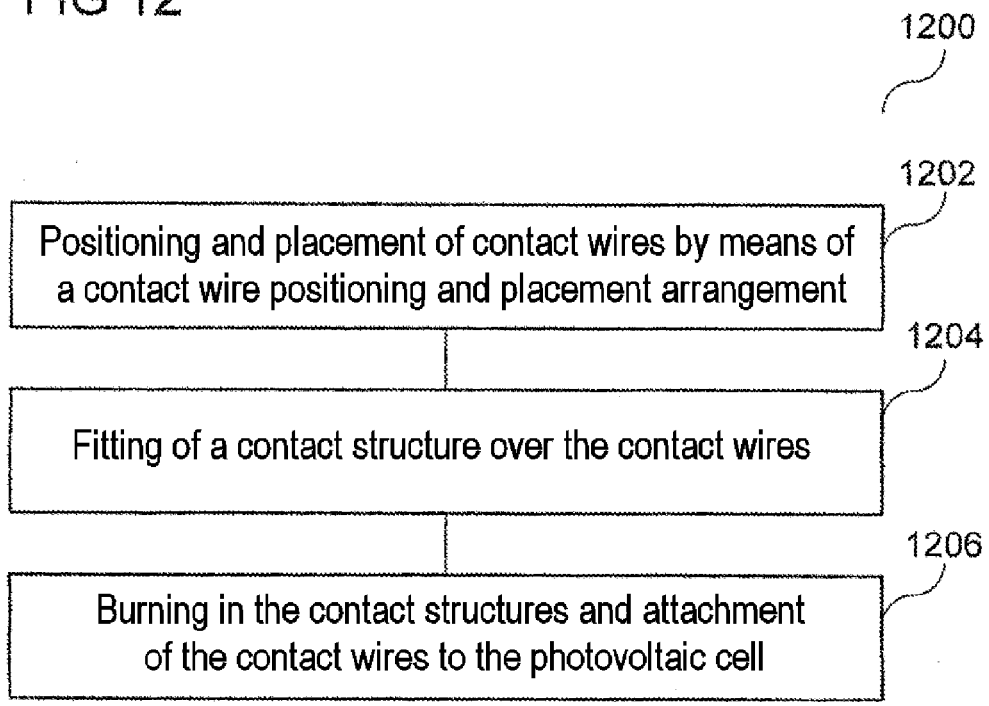
FIG. 12 shows yet another embodiment of a flowchart illustrating a method for fitting contact wires to a surface of a photovoltaic cell.

FIG. 12 shows a flowchart 1200 which illustrates yet another embodiment of a method for fitting contact wires to a surface of a photovoltaic cell.

According to various embodiments, contact wires are placed on the surface of the photovoltaic cell (for example on the surface of an antireflective layer which may be present) in 1202 by means of a contact wire positioning and placement device, for example by means of a contact wire positioning and placement device as has been described above. By way of example, the contact wires may be silver contact wires, alternatively copper contact wires which can be coated with a metal layer, for example clearly with a diffusion bather layer (for example with nickel or cobalt), or copper contact wires which can be coated with a metal layer, for example with a silver layer or Ni—Ag. The coating which may be provided (for example nickel, cobalt or silver) on the contact wires may, according to various embodiments, be applied electrochemically before positioning.

According to various embodiments, the contact structure, for example the contact fingers, can then be applied at any desired angle (not only parallel to the contact fingers) over the contact wires which have been placed in position, in 1204, for example by means of a printing process, for example by means of a screen printing process or by means of an extrusion printing process.

According to various embodiments, the contact structures are then burnt in in 1206, and the contact wires are fixed in the same process step, for example by means of a high-temperature step, for example at a temperature in a range from approximately 400° C. to approximately 900° C., for example for a time from approximately 1 minute to approximately 5 minutes.

In various embodiments, the arrangement may include a plurality of coating devices for coating the contact wires 210, with one contact wire in each case being associated with one coating device. By way of example, each coating device may be designed as is illustrated and described in FIG. 4. Furthermore, the plurality of coating devices may be designed for coating the contact wires 210 with solder material, flux or contact material before the positioning and placement of the contact wires 210 on the surface 204 of the photovoltaic cell 202.

A method for fitting contact wires to a surface (for example to a surface of a contact structure or a plurality of contact structures) of a photovoltaic cell (for example of a solar cell) is provided in various embodiments. The method may include feeding of the contact wires to a contact wire positioning and placement device; positioning and placement of the contact wires on the surface (for example on the surface of the contact structures) of the photovoltaic cell by means of the contact wire positioning and placement device; and attachment of the contact wires to the surface (for example to the surface of a contact structure or a plurality of contact structures) of the photovoltaic cell.

The use of the contact wire positioning and placement device makes it possible to position and place the contact wires (even a large number of contact wires) in a simple manner very exactly on the surface of the photovoltaic cell. In various embodiments, the contact wires can be passed through the contact wire positioning and placement device, and a multiplicity of contact wires can be positioned and placed very quickly and cost-effectively by appropriate (for example automated) control of the contact wire positioning and placement device. In various embodiments, the contact wires are not first of all placed onto an intermediate mount such as a film, but are positioned and placed directly on the surface of the photovoltaic cell thus resulting in a considerable simplification of the process of making contact with a photovoltaic cell.

In one refinement of the method, the feeding of the contact wires to a contact wire positioning and placement device may include feeding of the contact wires from a contact wire feed device.

Furthermore, the feeding of the contact wires to a contact wire positioning and placement device may include feeding of the contact wires from a plurality of actively moved contact wire rolls.

According to yet another development, the contact wire positioning and placement device may have a plurality of nozzles or eyes, wherein at least one contact wire is in each case passed through a respective nozzle or eye, for positioning and placement thereof onto the surface of the photovoltaic cell.

The method may furthermore include fitting of a contact structure to the surface of the photovoltaic cell. In one development, the contact structure may be fitted, for example, by means of a screen printing process or by means of an extrusion printing process.

The contact structure may have a plurality of contact fingers.

The contact structure may be fitted to the surface of the photovoltaic cell in the form of a line, in the form of a segment or in the form of a point.

In yet another refinement of the method, the contact wires may be placed on the contact structure at any desired angle (for example directly); and the attachment of the contact wires to the surface of the photovoltaic cell may include attachment of the contact wires with the contact structure or the contact structures. In various embodiments, the contact wires are placed along (that is to say clearly approximately parallel to the contact structures) the contact structures or at an angle to the contact structures, in particular at an angle of 90° (that is to say clearly approximately at right angles to the contact structures).

In yet another refinement of the method, the contact structure or contact structures can be burnt in on the surface of the photovoltaic cell; and after this, the contact wires can be attached with the contact structure or structures, for example by means of a soldered joint, a bonded joint or an electrically conductive adhesively bonded joint.

In various embodiments, the contact wires can be coated at least partially with solder material or with electrically conductive adhesive material before being placed on the contact structure or structures. The contact wires may be coated in the positioning and placement apparatus.

In yet another refinement of the method, the contact wires can be brought into contact with the contact structure or structures; and after this, the contact structure or structures is or are burnt in on the surface of the photovoltaic cell.

According to another development of the method, the contact structure or structures can be fitted to the surface of the photovoltaic cell, and the contact wires can be positioned and placed on the surface of the photovoltaic cell in a joint process step, wherein the contact structure or structures can then be burnt in on the surface of the photovoltaic cell.

By way of example, the contact wires can be at least partially coated with the material of the contact structure or structures in the positioning and placement apparatus; and the contact wires which have been coated with the material of the contact structure or structures can be positioned and placed on the surface of the photovoltaic cell by means of the contact wire positioning and placement arrangement.

According to another development of the method, the contact wires can be positioned directly on the antireflective layer of the photovoltaic cell. The contact structure may then be fitted at any desired angle, for example by means of a screen printing or extrusion printing process, and the contact structure can then be burnt in on the antireflective layer of the photovoltaic cell. In various embodiments, in a refinement of this development, the contact wires are placed at an angle of approximately 90° with respect to the contact structures (that is to say clearly approximately at right angles to the contact structures).

According to yet another development of the method, an antireflective layer, for example silicon nitride, can be applied to the emitter face of the photovoltaic cell. In this case, the contact wires can be applied to the (exposed) surface of the antireflective layer.

According to yet another development of the method, a paste composed of a material which can remove the material of the antireflective layer, for example an etching doping paste, may be applied to a part of the antireflective layer, such that this part of the antireflective layer is removed. This paste is then burnt in and a further paste, for example paste containing silver, is then printed onto the doped areas, after the burning-in step, in order to provide the contact structures. The contact wires can be placed on this paste, and the contact wires and the paste can be heated such that the paste is burnt into the surface of the photovoltaic cell.

It is also possible for the contact wires to be at least partially coated with a paste composed of a material which can remove the material of the antireflective layer; the coated contact wires are placed on the surface of the photovoltaic cell; and the contact wires and the paste are heated, such that the paste is burnt into the surface of the photovoltaic cell.

According to another refinement, the contact wires can be placed on the surface of the photovoltaic cell; the contact wires are at least partially coated with a paste composed of a material which can remove the material of the antireflective layer; and the contact wires and the paste are heated, such that the paste is burnt into the surface of the photovoltaic cell.

The paste may be free of silver.

After the paste has been burnt in, it is also possible for at least a part of the paste, which does not provide the contact between the contact wires and the photovoltaic cell, to be removed.

The contact wires may be attached (for example the burning-in process) to the surface of the photovoltaic cell by means of a laser beam.

The contact wires may include a metal, for example nickel, copper and/or silver, or some other suitable metal. Furthermore, the contact wires may have been or may be coated with a metal, for example with silver and/or nickel.

The attachment of the contact wires to the surface of the photovoltaic cell may include soldering, bonding or adhesive bonding of the contact wires to the surface of the photovoltaic cell.

Various embodiments provide a photovoltaic cell which has been connected or produced using one of the methods described above, or one of the methods which have been described above in more detail.

In various embodiments, the photovoltaic cell may have a cuboid shape. In various embodiments, the photovoltaic cell may, however, also have a non-cuboid shape. In these cases, the photovoltaic cell may be formed, for example, by cutting up (for example by cleaving) and thus subdividing a cuboid photovoltaic cell (whose shape is also reflected as a standard photovoltaic cell) to form a plurality of, for example, non-cuboid photovoltaic cells.

In various embodiments, a photovoltaic module is provided having a plurality of photovoltaic cells which are electrically coupled to one another, wherein one photovoltaic cell or a plurality of photovoltaic cells, or a plurality of photovoltaic cells which are electrically coupled to one another which has or have been connected or produced using one of the methods described above or one of the methods which will be described in more detail in the following text, is or are used.

In various embodiments, an arrangement is provided for fitting contact wires to a surface (for example to a surface of a contact structure or a plurality of contact structures) of a photovoltaic cell. The arrangement may have a contact wire feed device for feeding contact wires to a contact wire positioning and placement device; a contact wire positioning and placement device for positioning and placement of the contact wires on the surface (for example on the surface of a contact structure or of a plurality of contact structures) of the photovoltaic cell by means of the contact wire positioning and placement device; and an attachment device for attachment of the contact wires to the surface (for example to the surface of a contact structure or a plurality of contact structures) of the photovoltaic cell.

The contact wire feed device may have a plurality of contact wire rolls. One contact wire or a plurality of contact wires may be rolled up on each contact wire roll, and may be actively unrolled from it.

According to one refinement of the arrangement, the contact wire positioning and placement arrangement may have a plurality of nozzles or eyes, wherein at least one contact wire is in each case passed through a respective nozzle or eye for positioning and placement thereof on the surface of the photovoltaic cell.

According to another refinement of the arrangement, the arrangement may furthermore have a contact structure fitting device for fitting a contact structure (for example in the form of electrically conductive contact structures, for example in the form of so-called contact fingers) to the surface of the photovoltaic cell.

According to yet another refinement of the arrangement, the contact structure fitting device may be designed to fit the contact structure by means of a screen printing process or by means of an extrusion printing process. The contact structure fitting device may clearly, according to various refinements, have a screen printing device or an extrusion printing device (for example with a plurality of extrusion printing heads).

Furthermore, the contact structure fitting device may be designed to form contact fingers from the contact structure.

The contact wire positioning and placement arrangement may be designed such that the contact wires are placed directly on the contact structure; and the attachment device may be designed such that the contact wires are attached with the contact structure or the contact structures.

In yet another refinement, the attachment device may be designed such that the contact structure is burnt in on the surface of the photovoltaic cell; and such that the contact wires are then attached with the contact structure or the contact structures.

In yet another refinement, the arrangement may furthermore have a hold-down means, which is designed for making contact between the contact wires and the contact structure or the contact structures. The attachment device may be designed such that the contact structure or structures is or are then burnt in on the surface of the photovoltaic cell.

In yet another refinement, the contact wire positioning and placement device may be designed such that the contact structure is fitted to the surface of the photovoltaic cell, and the contact wires are positioned and placed on the surface of the photovoltaic cell, in a joint process step, wherein the attachment device is designed such that the contact structure or the contact structures is or are then burnt in on the surface of the photovoltaic cell.

The positioning and placement apparatus may furthermore be designed such that the contact wires are at least partially coated with the material of the contact structure or structures; and such that the contact wires that have been coated with the material of the contact structure or structures are positioned and placed on the surface of the photovoltaic cell by means of the contact wire positioning and placement device.

For example, the contact wire positioning and placement device may have at least one container through which the contact wires can be passed and in which the material of the contact structure or structures is contained, such that at least a part of the surface of the contact wires is coated with the material of the contact structure or structures. The contact wire positioning and placement arrangement may in this case be designed such that the contact wires which have been coated with the material of the contact structure or structures are positioned and placed on the surface of the photovoltaic cell by means of the contact wire positioning and placement device.

According to another refinement, the arrangement may have a device for application of a paste composed of a material which can remove the material of the antireflective layer to a part of the antireflective layer, such that this part of the antireflective layer is removed. The contact wire positioning and placement arrangement can be designed such that the contact wires are placed on the paste; and the attachment device may be designed such that the contact wires and the paste are heated, such that the paste is burnt into the surface of the photovoltaic cell.

According to yet another refinement, the contact wire positioning and placement arrangement can be designed such that the contact wires are at least partially coated with a paste composed of a material which can remove the material of the antireflective layer; and such that the coated contact wires are placed on the surface of the photovoltaic cell; and the attachment device can be designed such that the contact wires and the paste are heated such that the paste is burnt into the surface of the photovoltaic cell.

According to yet another refinement, the contact wire positioning and placement arrangement can be designed such that the contact wires are placed on the surface of the photovoltaic cell; and such that the contact wires are at least partially coated with a paste composed of a material which can remove the material of the antireflective layer; and the attachment device can be designed such that the contact wires and the paste are heated, such that the paste is burnt into the surface of the photovoltaic cell.

The paste may be free of silver.

Furthermore, the arrangement may include a device for removal of at least a part of the paste, which does not provide the contact between the contact wires and the photovoltaic cell, after the paste has been burnt in.

The contact wires may include a metal, for example nickel, copper, silver or any other suitable metal. Furthermore, the contact wires may be coated or may have been coated with a metal, for example with silver and/or nickel.

According to another development, the attachment device is designed for attachment of the contact wires to the surface of the photovoltaic cell by means of soldering, bonding or adhesive bonding of the contact wires to the surface of the photovoltaic cell.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for fitting contact wires to a surface of a photovoltaic cell, the method comprising:
    feeding the contact wires to a contact wire positioning and placement device, wherein the contact wire positioning and placement device comprises a plurality of nozzles or eyes, wherein at least one contact wire is in each case passed through a respective nozzle or eye, for positioning and placement thereof onto the surface of the photovoltaic cell;
    positioning and placing the contact wires on the surface of the photovoltaic cell by means of the contact wire positioning and placement device; and attaching the contact wires to the surface of the photovoltaic cell,
further comprising: fitting a contact structure to the surface of the photovoltaic cell, wherein the contact wires are at least partially coated with solder material or with electrically conductive adhesive material before being placed on the contact structure, wherein a reservoir configured to hold the solder material or electrically conductive adhesive material is accommodated in the plurality of nozzles or eyes of the contact wire positioning and placement device.

2. The method as claimed in claim 1, wherein the contact structure is fitted to the surface of the photovoltaic cell in the form of a line, in the form of a segment or in the form of a point.

3. The method as claimed in claim 2, wherein the contact structure is fitted by means of a screen printing process or by means of an extrusion printing process.

4. The method as claimed in claim 3, wherein the attachment of the contact wires to the surface of the photovoltaic cell comprises attachment of the contact wires with the contact structure.

5. The method as claimed in claim 4, wherein the contact wires are coated in the positioning and placement apparatus.

6. The method as claimed in claim 4, wherein the contact wires are brought into contact with the contact structure; and wherein the contact structure is then burnt in, together with the contact wires on the surface of the photovoltaic cell.

7. The method as claimed in claim 1, wherein the contact structure is fitted to the surface of the photovoltaic cell, and the contact wires are positioned and placed on the surface of the photovoltaic cell in a joint process step; and wherein the contact structure is then burnt in, together with the contact wires on the surface of the photovoltaic cell.

8. The method as claimed in claim 7, wherein the contact wires are at least partially coated with the material of the contact structure in the positioning and placement apparatus; and wherein the contact wires which have been coated with the material of the contact structure are positioned and placed on the surface of the photovoltaic cell by means of the contact wire positioning and placement arrangement.

9. The method as claimed in claim 1, wherein the contact wires are positioned directly on an antireflective layer on the photovoltaic cell; wherein the contact structure is then fitted by means of a screen printing or extrusion printing process; and wherein the contact structure is then burnt in on the antireflective layer of the photovoltaic cell.

10. The method as claimed in claim 1, wherein the contact wires are fixed to the surface of the photovoltaic cell by means of a laser beam.

11. An arrangement for fitting contact wires to a surface of a photovoltaic cell, the arrangement comprising: a contact wire feed device configured to feed contact wires to a contact wire positioning and placement device; a contact wire positioning and placement device configured to position and place the contact wires on the surface of the photovoltaic cell, wherein the contact wire positioning and placement arrangement comprises a plurality of nozzles or eyes, wherein at least one contact wire is in each case passed through a respective nozzle or eye for positioning and placement thereof on the surface of the photovoltaic cell; and an attachment device configured to attach the contact wires to the surface of the photovoltaic cell, further comprising: a hold-down device which is designed for making contact between the contact wires and a contact structure; and wherein the attachment device is designed such that the contact wires are then soldered, bonded or adhesively bonded to the contact structure,
wherein a reservoir configured to hold the soldering, bonding or adhesive bonding material is accommodated in the plurality of nozzles or eyes of the contact wire positioning and placement device.

12. The arrangement as claimed in claim 11, wherein the attachment device is designed such that the contact structure is then burnt in on the surface of the photovoltaic cell.

13. The arrangement as claimed in claim 11, further comprising: a plurality of coating devices for coating the contact wires; wherein one coating device is in each case associated with one contact wire.

14. The arrangement as claimed in claim 13, wherein the plurality of coating devices are designed for coating the contact wires with solder material, flux material or contact material before the positioning and placement of the contact wires on the surface of the photovoltaic cell.

* * * * *

UNITED STATES PATENT AND TRADEMARK OFFICE
CERTIFICATE OF CORRECTION

Page 1 of 1

PATENT NO. : 9,076,922 B2
APPLICATION NO. : 13/087434
DATED : July 7, 2015
INVENTOR(S) : Martin Kutzer et al.

It is certified that error appears in the above-identified patent and that said Letters Patent is hereby corrected as shown below:

Specification

Column 5, line 25: please delete "bather" between the words "diffusion" and "layer" and write "barrier" in place thereof Column 9, line 2: please delete "bather" between the words "diffusion" and "layer" and write "barrier" in place thereof Column 12, line 9: please delete "bather" between the words "diffusion" and "layer" and write "barrier" in place thereof Column 13, line 58: please delete "bather" between the words "diffusion" and "layer" and write "barrier" in place thereof Signed and Sealed this
First Day of December, 2015

Michelle K. Lee
*Director of the United States Patent and Trademark Office*